(12) United States Patent
Taft

(10) Patent No.: US 6,590,518 B1
(45) Date of Patent: Jul. 8, 2003

(54) APPARATUS AND METHOD FOR AN IMPROVED SUBRANGING ADC ARCHITECTURE USING LADDER-FLIP BUSSING

(75) Inventor: Robert Callaghan Taft, Munich (DE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/825,507

(22) Filed: Apr. 3, 2001

(51) Int. Cl.$^7$ ................................................ H03M 1/12
(52) U.S. Cl. ...................... 341/156; 341/118; 341/120; 341/143; 341/154; 341/155
(58) Field of Search ................................. 341/156, 154, 341/118, 120, 155, 143

(56) References Cited

U.S. PATENT DOCUMENTS

| | | | | | |
|---|---|---|---|---|---|
| 5,296,858 | A | * | 3/1994 | Moyal ........................... | 341/156 |
| 5,450,085 | A | * | 9/1995 | Stewart et al. ............... | 341/159 |
| 5,554,989 | A | * | 9/1996 | Kumamoto et al. ......... | 341/159 |
| 5,661,481 | A | * | 8/1997 | Muramatsu .................. | 341/120 |
| 6,014,097 | A | * | 1/2000 | Brandt ......................... | 341/156 |
| 6,091,352 | A | * | 7/2000 | Morisson .................... | 341/156 |

OTHER PUBLICATIONS

Dingwall et al., "An 8–MHz CMOS Subranging 8–Bit A/D Converter," *IEEE Journal of Solid–State Circuits*, Dec. 1985, pp. 1138–1143.

Mangelsdorf, "A 400–MHz Input Flash Converter with Error Correction," *IEEE Journal of Solid–State Circuits*, Feb. 1990, pp. 184–191.

Ito et al., "A 10 bit 20 MS/s 3 V Supply CMOS A/D Converter," *IEEE Journal of Solid–State Circuits*, Dec. 1994, pp. 1531–1536.

Brandt et al., "A 75–mW, 10–b, 20–MSPS CMOS Subranging ADC with 9.5 Effective Bits at Nyquist," *IEEE Journal of Solid–State Circuits*, Dec. 1999, pp. 1788–1795.

Taft et al., "A 100–MSPS 8–b CMOS Subranging ADC with parametric operation from 3.8 V down to 2.2V," *CICC*, 2000, 4 pages.

\* cited by examiner

*Primary Examiner*—Michael Tokar
*Assistant Examiner*—Linh Van Nguyen
(74) *Attorney, Agent, or Firm*—Merchant & Gould P.C.; Joshua W. Korver

(57) ABSTRACT

An electronic circuit that converts an analog input to a digital signal includes a series "string" of resistors that provides reference signals with ascending values across the string. The reference signals are organized in banks of reference signals, with each adjacent set sharing a major code boundary. A coarse bank of comparators compare the analog input to the major code boundary reference signals and provide a coarse logic output. Each bank of reference signals has a corresponding bank of switches, with each switch associated with a particular reference signal in the bank. All of the switches in a particular bank are closed or opened in unison when selected. A particular bank is selected based on the coarse logic output signal. The reference values corresponding to the selected bank are coupled to a fine bank of comparators, each fine bank comparator comparing the analog input signal to one of the selected reference values. The fine bank of comparators output a fine logic output that corresponds to one of a thermometer code and a reverse thermometer code. The switches that couple the reference values to the fine bank of comparators are arranged in a "ladder-flip" architecture, where switches in adjacent banks share common junction nodes to one of the comparators in the fine bank. The switches that are connected to a particular common junction node are equidistant about the common major code boundary. The DNL errors that occur as a result of switching between different comparators across major code boundaries are reduced.

20 Claims, 5 Drawing Sheets

US 6,590,518 B1

APPARATUS AND METHOD FOR AN IMPROVED SUBRANGING ADC ARCHITECTURE USING LADDER-FLIP BUSSING

FIELD OF THE INVENTION

The present invention relates to the field of analog-to-digital converters (ADC's), and in particular, to a subranging ADC architecture that includes switches in a ladder arrangement.

BACKGROUND OF THE INVENTION

Analog-to-digital converters (ADC's) are useful in digital signal processing applications as well as video, imaging, and digital communication applications. An ADC takes an analog input and converts it into a digital code, i.e. "digitizes" the analog signal. ADC's can be designed in a variety of ways, using various analog and digital components such as comparators, sample-and-hold circuits, counters, as well as others.

A typical ADC circuit may include a series of reference signals (e.g. reference potentials), a comparator, and some switching logic. The switching logic selectively routes reference signals to the comparator. The comparator compares the reference signals to the analog input signal. The comparator output changes logic states as a result of the comparison of the reference signal to the analog input signal. The digital output code results from encoding the output of multiple comparators.

A "flash" type of ADC circuit includes a series of reference signals, encoding logic, and multiple comparators. Each reference signal has a corresponding comparator ($2^N-1$ comparators for an N-bit digital code and $2^N+1$ comparators for an N-bit digital code with overrange). Each comparator outputs a logic value depending on whether the analog input signal has a value that is higher or lower than its associated reference value. All reference signals are simultaneously compared to the analog input signal by their corresponding comparator. The output of every comparator is received by the encoding logic which determines the digital code corresponding to the analog signal.

A "subranging" type of ADC circuit includes a series of reference signals, encoding logic, and multiple comparators, similar to the "flash" type of ADC. Flash ADCs offer high speed, digitizing an analog input signal in a single clock cycle. In contrast, a "subranging" architecture converts the analog input signal into a digital code in two steps. A coarse comparison is followed by a fine comparison for the subranging ADC. The subranging ADC therefore requires two-clock-cycles to complete a conversion of the analog input signal to a digital code. This is considered a disadvantage compared to the flash ADC which converts the analog input signal to a digital code in a single step. However, in a subranging ADC, the number of comparators required for a conversion is $2^{1+(N/2)}-1$ comparators for an N-bit ADC, which is much less than that of the flash ADC. For example, an 8-bit flash ADC requires approximately 256 comparators, while an 8-bit subranging ADC requires approximately 32 comparators. The reduced number of comparators for a subranging ADC results in less chip area taken up on the integrated circuit than for a flash ADC. The reduction in chip area required by the subranging ADC is considered an advantage over the flash ADC.

The outputs of the comparators in a flash ADC and a subranging ADC generate a code called "thermometer code." The thermometer code is based on the architecture of both flash and subranging ADCs. When the tap point of a particular comparator is below the level of the input signal, the particular comparator outputs a high logic level. When the tap point of a comparator is above the level of the reference signal, the comparator outputs a low logic level. Over an entire bank of comparators in a flash or subranging ADC, the outputs of the comparators below the reference signal should have a high logic level, and the outputs of the comparators above the reference voltage should have a low logic level.

SUMMARY OF THE INVENTION

Briefly stated, in accordance with the present invention an electronic circuit that converts an analog input to a digital signal includes a series "string" of resistors that provides reference signals with ascending values across the string. The reference signals are organized in banks of reference signals, with each adjacent set sharing a major code boundary. A coarse bank of comparators compare the analog input to the major code boundary reference signals and provide a coarse logic output. Each bank of reference signals has a corresponding bank of switches, with each switch associated with a particular reference signal in the bank. All of the switches in a particular bank are closed or opened in unison when selected. A particular bank is selected based on the coarse logic output signal. The reference values corresponding to the selected bank are coupled to a fine bank of comparators, each fine bank comparator. comparing the analog input signal to one of the selected reference values. The fine bank of comparators output a fine logic output that corresponds to one of a thermometer code and a reverse thermometer code. The switches that couple the reference values to the fine bank of comparators are arranged in a "ladder-flip" architecture, where switches in adjacent banks share common junction nodes to one of the comparators in the fine bank. The switches that are connected to a particular common junction node are equidistant about the common major code boundary. The DNL errors that occur as a result of switching between different comparators across major code boundaries are reduced.

According to a feature of the invention, an apparatus for producing logic outputs from an analog input voltage, includes: a reference voltage circuit that has a first set of reference values and a second set of reference values, the first and second set of reference values having a common reference value that corresponds to a major code boundary. The apparatus further includes: a coarse comparator that produces a coarse logic output that corresponds to a comparison between the analog input voltage and the common reference value and at least two fine comparators that produce fine logic outputs that correspond to a comparison between the analog input voltage and a selected one of the first and second sets of reference values, the fine logic output corresponding to a fist code type when the first set of reference values is selected and corresponding to a second code type when the second set of reference values is selected, the second code type being different from the first code type whereby differential nonlinearity errors across the major code boundary are minimized.

According to another feature of the invention, a method of converting an analog input voltage to a digital code includes: comparing the analog input voltage to a major reference value that corresponds to a major code boundary in a series of reference values and producing a coarse logic output in response to the comparison of the analog input voltage to the major reference value, the coarse logic output indicating whether the analog input voltage is one of higher and lower than the major reference value. the method further includes: selecting one of a first and second bank of reference values in response to the coarse logic output, selecting the first bank when the analog input voltage is higher than the major reference value and selecting the second bank when the analog input voltage is lower than the major reference value, comparing the analog input voltage to the selected bank of reference values, producing a fine logic output in response to the comparison between the analog input voltage to the selected bank of reference values, the fine logic output being a first code type when the selected bank is the first reference bank and a second code type when the selected bank is the second reference bank, the first code type being different from the second code type, and producing the digital code in response to the coarse logic output and fine logic output wherein errors occurring in the digital code are minimized.

According to yet another feature of the invention, an apparatus for converting an analog input voltage to a digital signal includes a coarse comparison means for comparing the analog input voltage to a voltage of a common reference node to produce a coarse output. An ordered set of junction nodes is included having associated discrete voltages arranged in an order. Junction means are also included for providing discrete voltages corresponding to an ordered set of junction nodes arranged in an ascending order. A fine comparison means compares the analog input voltage to the associated discrete voltages to produce a fine output. The fine comparison means is arranged in an ascending order such that each of the fine comparison means has a unique corresponding junction node of the ordered set of junction nodes. The apparatus also includes means for selecting one of a first and second set of reference nodes that have a common major code boundary corresponding to the common reference node. The apparatus further includes means for selectively coupling the ordered set of junction nodes to the selected one of a first and second set of reference nodes such that the first set of reference nodes is coupled to the ordered set of junction nodes in an ascending order when selected, matching the ascending order of the second set of comparison means. The second set of reference nodes is coupled to the ordered set of junction nodes in a descending order when selected, opposite the ascending order of the second set of comparison means whereby differential non-linearity errors occurring at the major code boundaries are minimized. The apparatus further includes means for producing the digital signal in response to the coarse output and fine output.

DETAILED DESCRIPTION OF THE PREFERRED EMBODIMENT

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

The present invention relates to a subranging Analog-to-Digital Converter (ADC) architecture that reduces Differential NonLinearity error (DNL) at major code transitions in the converter. The subranging ADC includes two banks of comparators and a series of reference signals. The first bank of comparators are referred to as a "coarse bank", while the second bank of comparators are referred to as a "fine bank".

The reference signals may be generated by any appropriate method including, but not limited to, a series of resistors coupled between a high reference signal and a low reference signal. In one example, each reference signal corresponds to a tap point in a string of series connected resistors. Other alternative ways of generating reference voltages or currents may be adapted for use in the present subranging architecture, and are within the scope of the present invention.

The bank of comparators associated with the fine bank of a subranging ADC are coupled to the reference tap points of the reference voltage line in a "flipped" fashion. Reference tap points at both sides of a major code boundary are coupled to the same comparator. The arrangement of the coupling to the comparators snake up and down across the reference tap points such that the DNL errors observed at the major code boundaries are minimized.

The analog input signal is often a time varying analog voltage. A sample and hold circuit is used to periodically store the analog voltage at an instant of time corresponding to a sampling frequency. The ADC uses the stored analog voltage as the analog input signal during the conversion cycle. It is understood and appreciated that slow time varying input signals may not require a sample and hold circuit (i.e. the conversion time is an order of magnitude faster than the fastest frequency component of the time varying analog input signal). For the purposes of the discussion below, the sampled analog input signal or the raw analog input signal is referred to simply as the analog input signal (INPUT).

Figure 1:
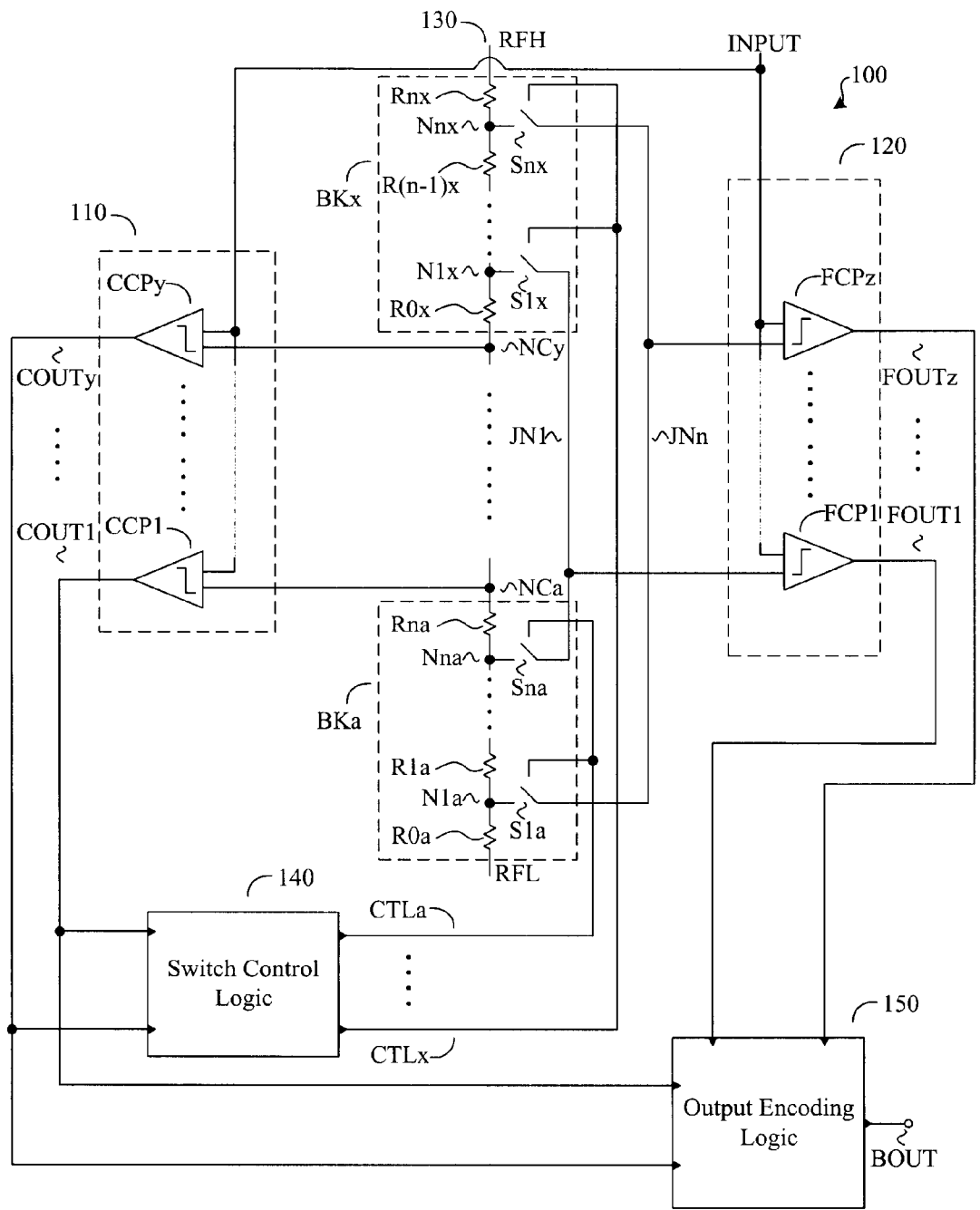
FIG. 1 illustrates a subranging ADC using an architecture that reduces DNL error at major code boundaries.

FIG. 1 illustrates an example subranging ADC using the architecture of the present invention that reduces DNL errors at major code boundaries. The ADC (100) includes a reference voltage circuit (130), a coarse bank of comparators (110), a fine bank of comparators (120), a switch control logic circuit (140), and an output encoding logic circuit (150).

The reference voltage circuit includes at least two banks of resistors (BKa, ... BKx) that are series coupled between a high reference potential (RFH) and a low reference potential (RFL). Each resistor bank includes a set of n+1 resistors (e.g., R0a, ... Rna) that are coupled together as a series "string" of resistors, and a set of n reference nodes (e.g. N1a, ... Nna) that are tap points in the resistor string. Each tap point in the resistor string corresponds to a particular reference voltage. For example, a first resistor bank (BKa) includes resistors R0a, ... Rna and tap points N1a, ... Nna, while another resistor bank (BKx) includes resistors R0x, ... Rnx with tap points N1x, ... Nnx.

Each resistor bank (BKa, . . . BKx) includes one or more switches (S1a, . . . Snx) that are configured to couple one or more tap points (e.g., N1a, . . . Nnx) in the resistor string (e.g., R0a, . . . Rnx) to the fine bank of comparators (120). For Example, the first resistor bank (BKa) includes n switches (S1a, . . . Sna) that are arranged to couple a respective reference node (N1a, . . . Nna) to a particular fine bank comparator (FCP1, . . . FCPz). Each reference node (N1a . . . Nna, . . . , N1x, . . . Nnx) between each resistor (R0a, . . . Rna, . . . , R0x, . . . Rnx) may be coupled to a switch (S1a, . . . Snx), a comparator (CCP1, . . . CCPy) of the coarse bank (110), or both. The switches (S1a, . . . Snx) are coupled in series between their associated reference nodes (N1a, . . . Nnx) and a set of junction nodes (JN1, . . . JNn). Each switch (S1a, . . . Snx) is responsive to a respective control signal (CTLa, . . . CTLx).

The coarse bank (110) includes one or more comparators that are arranged to determine which bank (e.g. BKa, . . . BKx) of resistor tap points should be used for a particular A/D conversion. In the example shown in FIG. 1, the coarse comparator bank (110) includes at least two comparators (CCP1, . . . CCPy). The first comparator (CCP1) of the coarse bank (110) includes an input coupled to a reference node (NCa), another input receiving an analog input signal (INPUT), and a logic output (COUT1). The second comparator (CCPy) of the coarse bank (110) includes an input coupled to a reference node (NCy), another input receiving an analog input signal (INPUT), and a logic output (COUTy). The logic outputs of the coarse bank comparators (COUT1, . . . COUTy) are coupled to the switch control logic circuit (140) and the output encoding logic circuit (150).

The fine bank (120) includes comparators that are arranged to analyze the analog input signal with respect to a particular bank of reference voltages. In the example shown in FIG. 1, the fine bank (120) includes at least two comparators (FCP1, . . . FCPz). The first comparator (FCP1) of the fine bank (120) includes an input coupled to a junction node (JN1), another input receiving an analog input signal (INPUT), and a logic output (FOUT1). The second comparator (FCPz of the fine bank (120) includes an input coupled to a junction node (JNn), another input receiving an analog input signal (INPUT), and a logic output (FOUTz). The logic outputs of the fine bank (FOUT1, . . . FOUTz) are coupled to the output encoding logic circuit (150).

The switch control logic circuit (140) produces control signals (CTLa, . . . CTLx) for each switch (S1a, . . . Snx) in the resistor banks (BKa, . . . BKx). All switches (S1a, . . . Snx) in a particular resistor bank (BKa, . . . BKx) share a common control signal (CTLa, . . . CTLx) such that all switches in the particular resistor bank are actuated in concert. For example, the first resistor bank (BKa) includes switches (S1a, . . . Sna) that are all actuated by the CTLa control line, while the second resistor bank (BKx) includes switches (S1x, . . . Snx) that are all actuated by the CTLx control line. The switch control logic circuit (140) receives the output logic (COUT1, . . . COUTy) from the coarse bank of comparators (110) and actuates the switches (S1a, . . . Sna, . . . , S1x, . . . Snx) accordingly.

In this particular embodiment, the number of comparators (CCP1, . . . CCPy) present in the coarse bank (110) corresponds to one less than the number of reference voltage banks (BKa, . . . BKx) present in the reference voltage circuit (130), (i.e. y=x−1). Also, in this embodiment, the number of comparators (FCP1, . . . FCPz) present in the fine bank (120) corresponds to the number of switches (S1a, . . . Snx) or number of reference nodes (N1a, . . . Nnx) present within each resistor bank (BKa, . . . BKx), (i.e. z=n).

The analog input signal (INPUT) is analyzed by the coarse bank of comparators (110) in the ADC (100). Each comparator (CCP1, . . . CCPy) present in the coarse bank (110) simultaneously compares the value of the analog input signal (INPUT) with the value of each comparator's (CCP1, . . . CCPy) corresponding reference node (NC1, . . . NCy). Each comparator (CCP1, . . . CCPy) of the coarse bank (110) outputs a logic output (COUT1, . . . COUTy) based upon the comparison. The value of the logic output (COUT1, . . . COUTy) depends on whether the value of the comparator's (CCP1, . . . CCPy) reference node (NCa, . . . NCy) is higher or lower than the value of the analog input signal (INPUT).

The logic outputs of the coarse bank (COUT1, . . . COUTy) produce a thermometer code. Each comparator (CCP1, . . . CCPy) of the coarse bank (110) outputs a "0" if the analog input signal (INPUT) has a value that is lower than the value of the comparator's associated reference node (NCa, . . . NCx). Each comparator (CCP1, . . . CCPy) of the coarse bank (110) outputs a "1" if the analog input signal (INPUT) has a value that is higher than the value of the comparator's associated reference node (NCa, . . . NCx). Thus, ideally, the coarse bank comparators will output logic signals that appear similar to the mercury in a thermometer, with logic "1" outputs on the bottom comparators rising up to the logic "0" outputs on the top comparators.

The switch control logic (140) uses the logic output (COUT1, . . . COUTy) of the coarse bank (110) to control the closing of the switches (S1a, . . . Snx). The switch control logic produces a control signal (CTLa, . . . CTLx) for each resistor bank (BKa, . . . BKx). The thermometer code from the logic outputs (COUT1, . . . COUTy) are used to determine which control signal (corresponding to a particular resistor bank) should be activated. When a control signal (CTLa, . . . CTlx) is activated, the corresponding bank's switches (S1a, . . . Sna, . . . , S1x, . . . Snx) are closed.

Closing a set of switches (S1a, . . . Sna, . . . , S1x, . . . Snx) couples the reference nodes (N1a, . . . Nnx) corresponding to the set of switches (S1a, . . . Sna, S1x, . . . Snx) to the corresponding junction nodes (JN1, . . . JNn). The comparators (FCP1, . . . FCPz) of the fine bank (120) compare the value of these reference nodes (N1a, . . . Nnx) to the value of the analog input signal (INPUT). Each comparator (FCP1, . . . FCPz) of the fine bank (120) outputs a logic output (FOUT1, . . . FOUTz) based upon the comparison. The value of the logic output (FOUT1, . . . FOUTz) depends on whether the value of the comparator's (FCP1, . . . FCPz) reference node (N1a, . . . Nnx) is higher or lower than the value of the analog input signal (INPUT).

The logic outputs (FOUT1, . . . FOUTz) of the fine bank (120) produce a modified thermometer code based on the arrangement of the switches (S1a, . . . Snx). The format of the thermometer code depends upon the order of the switches (S1a, . . . Snx) that are coupled to the junction nodes (JN1, . . . JNn), and the resistor bank (BKa, . . . BKx) that is selected for conversion. For Example, the logic outputs of the fine bank of comparators (120) for a resistor bank produce a thermometer code that is in an opposite direction with respect to the logic outputs that correspond to an adjacent resistor bank. The output encoding logic circuit (150) converts the thermometer code of the fine bank (120) to another digital code (BOUT), and accounts for changes in the thermometer code direction for adjacent selected resistor banks. The digital code (BOUT) may be a binary code or some other type of code.

The output encoding logic circuit (150) uses the logic outputs (COUT1, . . . COUTy, FOUT1, . . . FOUTz) of both the coarse bank (110) and the fine bank (120) to determine a digital code (BOUT) representing the digitized version of the analog input signal (INPUT). The output encoding logic circuit (150) may include two different logic circuits (not shown), a first encoder circuit corresponding to a thermometer code in a first direction, and a second encoder circuit corresponding to a thermometer code in a second direction that is the opposite of the first direction. The output encoding logic circuit (150) selects one of the first encoder circuit and the second encoder circuit based upon the logic output (COUT1, ... COUTy) received from the coarse bank (110). In light of the above discussion, it is understood and appreciated that the output encoding logic circuit (150) may be implemented using other logic configurations.

In one embodiment, the Most-Significant-Bits (MSBs) of the digital code (BOUT) is obtained by analyzing the logic outputs (COUT1, ... COUTy) of the coarse bank (110) of comparators. The Least-Significant-Bits (LSB's) of the digital code (BOUT) are obtained by analyzing the logic outputs (FOUT1, ... FOUTz) of the fine bank (120) of comparators. In another embodiment, the LSBs are determined by analyzing the logic outputs (COUT1, ... COUTy) of the coarse bank of comparators (110) together with the logic outputs (FOUT1, ... FOUTz) of the fine bank of comparators (120). The MSBs and LSBs together represent the digital code (BOUT).

In the Example shown in FIG. 1, the switch control logic circuit (140) is separate from the output encoding logic circuit (150). It is understood and appreciated that the switch control logic circuit (140) can be combined with the output encoding logic circuit (150) in a single control logic circuit (not shown). It is also appreciated that the output encoding logic circuit (150) can contain other logic in addition to the logic for converting thermometer code or reverse thermometer code to another type of digital code. For example, the encoding logic can also have correction logic. The correction logic identifies and corrects errors in the thermometer or reverse thermometer code. For thermometer code, ideally, the logic outputs should resemble a thermometer with the logic outputs are logic "0's" for the comparators coupled to reference values higher than the value of the input signal and logic "1's" for those below the value of the input signal. Under certain conditions however, the code is not ideal and contains errors. If a logic "1" is found above a logic "0" in the case of thermometer code, an error has occurred. Errors of this type are often referred to as "bubbles" as they resemble bubbles in the mercury of a thermometer. The correction logic identifies and corrects "bubbles" or other types of errors in the thermometer code or reverse thermometer code prior to producing the digital signal.

In FIG. 1, the architecture of the reference banks (BKa, ... BKx) is not uniform. The architecture used for coupling the reference nodes (N1a, ... Nnx) to the junction nodes (JN1, ... JNn) is a "ladder-flip" architecture. In the ladder flip architecture, the connection for each bank's set of switches (S1a, ... Sna, ..., S1x, ... Snx) is in a flipped arrangement with respect to an adjacent bank's switch arrangement. The junction nodes (JN1, ... JNn) are coupled to the switches (S1a, ... Snx) and reference nodes (N1a, ... Nnx) in opposite order for adjacent reference banks (BKa, ... BKx). This ladder-flip architecture reduces a type of error, known as Differentially NonLinearity (DNL) error, associated with the digital code of a subranging ADC.

DNL error in an ADC is defined as the deviation in code width from the value of 1 Least Significant Bit (1 LSB). If DNL errors are large, the output code-widths may represent excessively large and small ranges of input voltages. Also, if the DNL is more negative than −1 LSB, the code-width disappears entirely and the ADC will have at least one missing code.

DNL errors at major code boundaries may occur from the use of different comparators for reference nodes bordering adjacent resistor banks. The different comparators may have different performance characteristics that result from various manufacturing, processing, or operational differences. For example, each comparator may be subjected to different temperature gradients during operation resulting in performance differences such as: different input referred offset voltages, different amounts of gain, as well as others. Similarly, manufacturing differences between each comparator may create performance differences between comparators. Physical layout and physical orientation of the comparators in the layout may also create performance differences. These differences effect the operation of an ADC at major code boundaries. The effect may be manifested as DNL errors. The architecture of the present invention eliminates DNL errors caused by differences in comparators at the major code boundaries.

Figure 2:
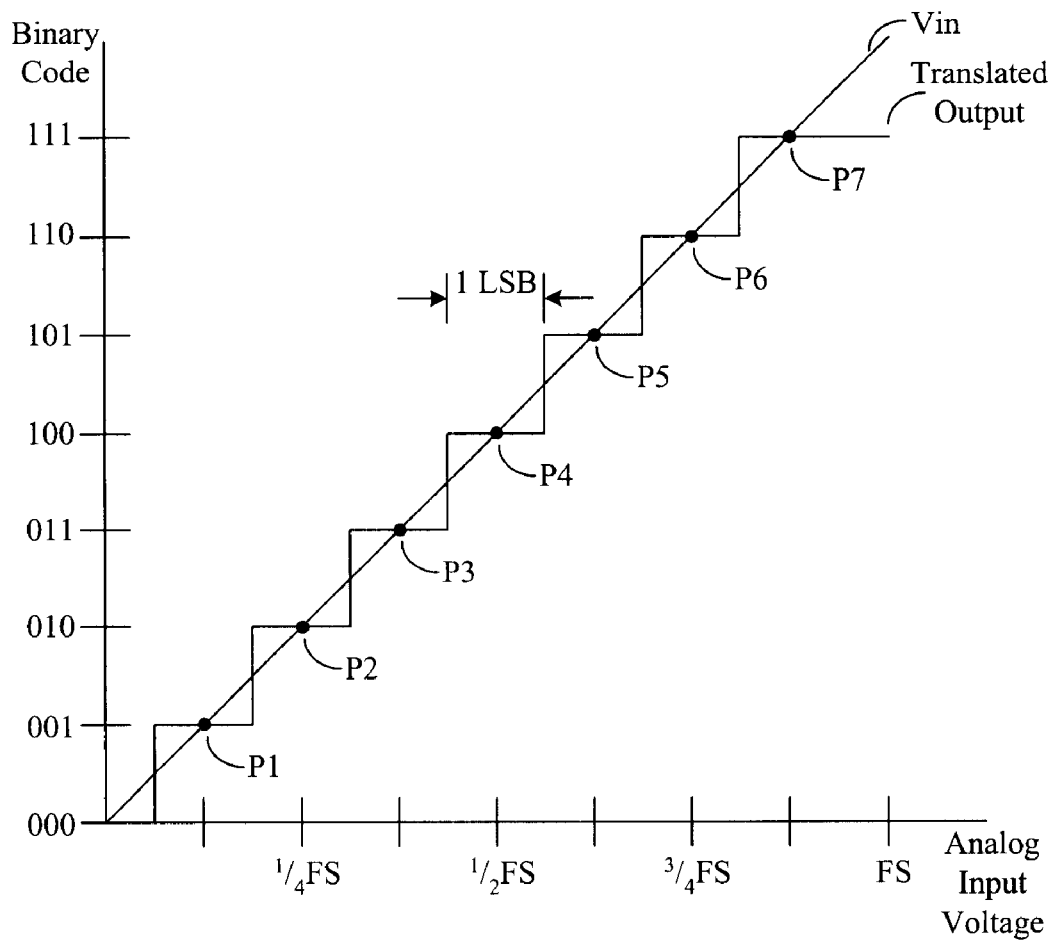
FIG. 2 illustrates a graph of the ideal digital code of a subranging ADC with a linear input voltage, containing no DNL errors.

FIG. 2 illustrates a graph of the analog-to-digital conversion of a subranging ADC containing no analog-to-digital conversion errors. In this figure, the analog input signal to the ADC is a linear analog voltage (Vin). The analog input signal (Vin) is a voltage that is in a range from 0V to the full-scale-voltage (FS). The full-scale voltage (FS) corresponds to the maximum analog input signal (Vin) that can be converted to a digital code word. In this example, the digital conversion of the analog signal corresponds to a three bit binary code (000-111). For each binary code, there is an associated analog voltage (referred to hereinafter as a translated output) that corresponds to a particular analog input signal (see points P1–P7). For example, the binary code 111 corresponds to a full-scale voltage (FS) as shown by a point (P7), while the binary code 100 corresponds to half of the full-scale voltage (½FS) as shown by point P4. The translated output follows the analog input signal (Vin), stepping up in uniform binary increments according to the increase in analog input signal (Vin) with each point (P1–P7) intersecting the input voltage (Vin). The width of each step in the ideal translated output corresponds to 1 LSB, each step being centered about a corresponding point (P1A–P7A). The points (P1–P7) correspond to intersections between the translated output and the analog input signal (Vin). The DNL error is measured as the width of the step greater than its ideal width (1 LSB). For the graph shown in FIG. 2, the DNL error is consistently 0 LSB.

Figure 3:
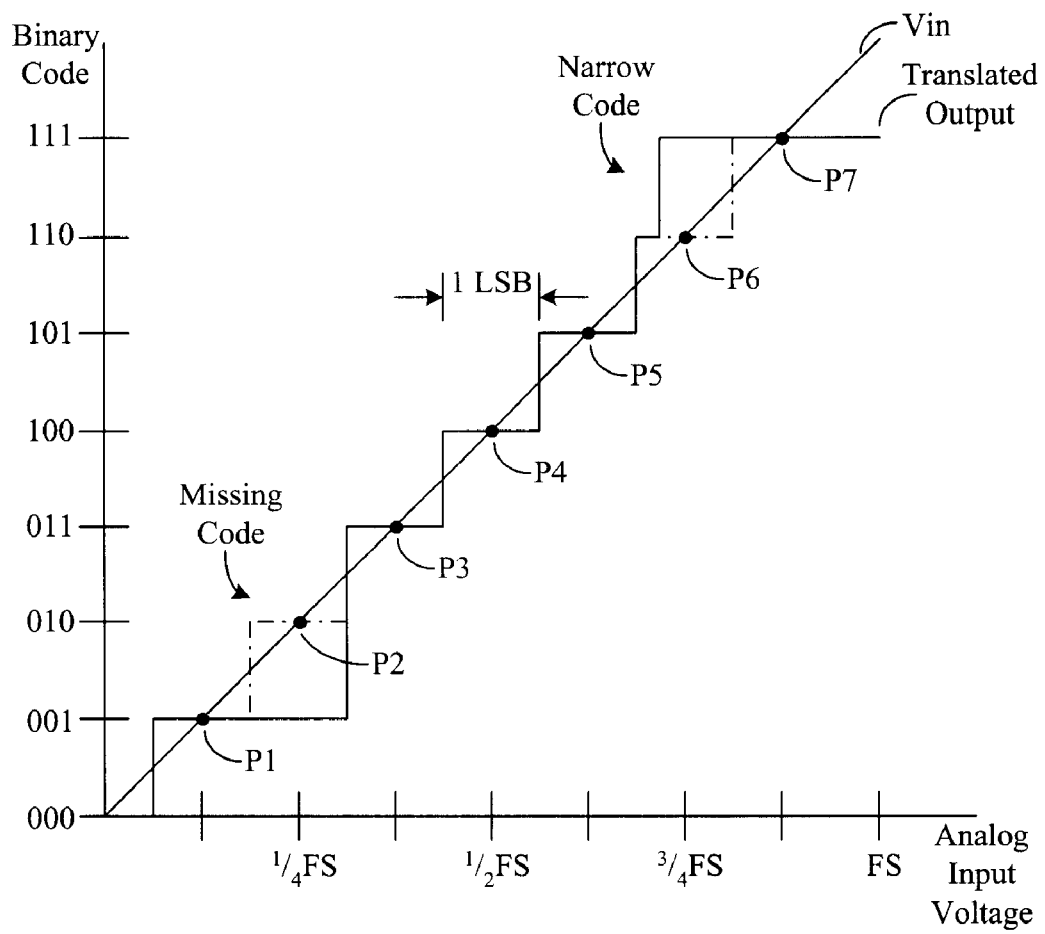
FIG. 3 illustrates a graph of the non-ideal digital code of a subranging ADC with a linear input voltage.

FIG. 3 illustrates a graph of the analog-to-digital conversion of a subranging ADC that includes analog-to-digital conversion errors. As in FIG. 2, the input signal to the ADC is a linear input voltage (Vin) that is in a range from 0V to the full-scale-voltage (FS), and the ADC produces a three bit (000-111) binary code as a result of conversion. The intersecting points (P1–P7) of FIG. 2 are included on the graph in FIG. 3 to show where the translated output ideally intersects the analog input signal (Vin). Some of the points (P2, P6) on the graph are not intersected by the translated output. A missing code occurs when the input voltage (Vin) increases beyond the threshold of the next binary code, yet yields the same binary code output. Notice that in FIG. 3 binary code 010 has no corresponding translated output. The lack of the translated output at binary code 010 corresponds to a missing code in the ADC. Also, a narrow code occurs when a very slight increase (or decrease) in the analog input signal (Vin) results in a change in the binary code (i.e. see binary code 110 near point P6 on FIG. 3). In this graph, DNL errors are observed as differences in the width of adjacent steps in the translated output.

The architecture of the present invention reduces the occurrence of DNL errors that occur over major code boundaries. In FIG. 1, a major code boundary occurs when the value of the analog input signal (INPUT) moves from one resistor bank (BKa, . . . BKx) to another. In part, the DNL errors may occur from the change from one comparator to another comparator as the major code boundary is crossed. The ladder-flip arrangement smoothes the transition by using the same comparator as the major code boundary is crossed. In FIG. 1, the value of the reference node (N1a, . . . Nnx) on each side of the major code boundary is compared to the value of the analog input signal (INPUT) using the same fine bank comparator (FOUT1, . . . FOUTz). By using the same fine bank comparator (FOUT1, . . . FOUTz), DNL errors caused by differences in comparators are eliminated. For example, a particular array of comparators may have a gradient in offset voltage induced by localized noise or temperature sources. When different comparators are used for the comparisons on each side of the major code boundary, the different comparators may be separated by a large distance (i.e., physical distance on the chip). When separated by a large distance, the gradient in offset voltage may induce DNL errors. Having the same comparator used for the comparisons on each side of the major code boundary eliminates the effect of the gradient by eliminating the distance factor. By using the same comparator for the comparisons on each side of the major code boundary, the DNL errors at the major code boundaries in the ADC (100) are reduced.

In light of the above discussion, it is appreciated and understood that the gradient in offset voltage may induce a higher absolute number or more severe DNL errors without using the ladder-flip configuration of the present invention. The width of an output code as shown in FIG. 3 is determined by two different comparators. A first comparator sets the first edge of the code and a second comparator sets the second edge. Therefore, the DNL error effecting each code can be introduced by offset errors of more than one comparator. However, the more correlated the offset errors of the first and second comparators, the smaller the DNL error. For example, temperature gradients cause offset errors that are highly correlated. The offset errors are highly correlated because they are caused by a common source. The errors are of the comparators are also highly correlated when averaging or interpolation techniques are used to assist in producing the digital code. Such averaging and interpolation techniques are often used to reduce the DNL error by purposefully correlating the offset errors of comparators coupled to adjacent reference nodes. The effectiveness of these techniques fails at major code boundaries. At major code boundaries the two comparators coupled to adjacent reference nodes are separated by a large distance on the fine comparator bank. The distance between the comparators can lead to larger DNL errors at the major code boundaries. The ladder-flip configuration eliminates the distance between the comparators, increasing the effectiveness of averaging and interpolation techniques to reduce the occurrence of DNL errors.

Figure 4:
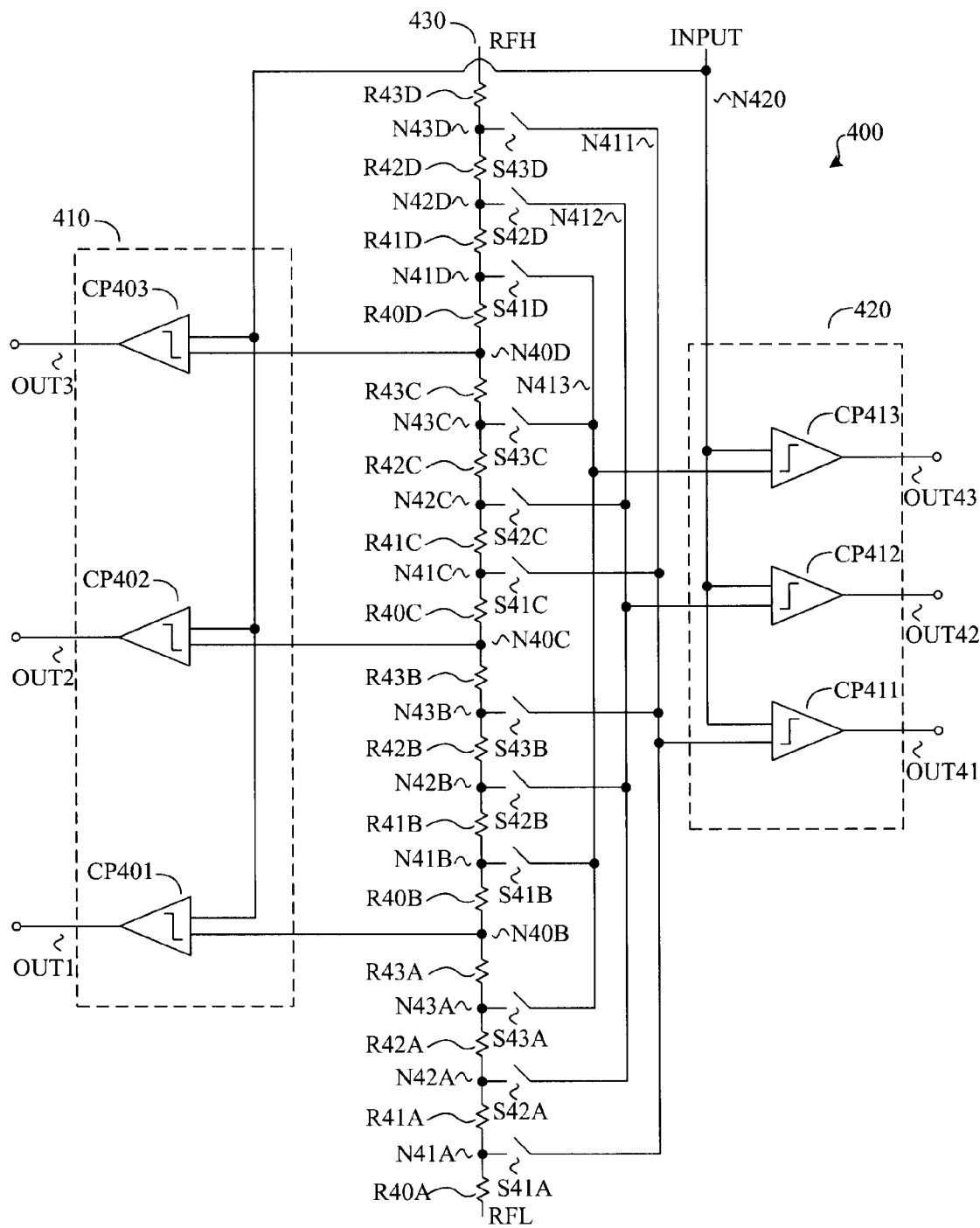
FIG. 4 illustrates an example subranging ADC using the architecture that reduces DNL error at major code boundaries.

FIG. 4 illustrates an example subranging ADC using the architecture that reduces DNL error at major code boundaries in accordance with the present invention. The ADC (400) includes a reference voltage circuit (430), a coarse bank of comparators (410), and a fine bank of comparators (420).

The reference voltage circuit (430) includes four banks of resistors in accordance with the banks described in FIG. 1. The first bank (bank "A") includes resistors (R40A–R43A). The second bank (bank "B") includes resistors (R40B–R43B). The third bank (bank "C") includes resistors (R40C–R43C). The fourth bank (bank "D") includes resistors (R40D–R43D). The resistors (R40A–R43D) are coupled together as a series "string" of resistors between a high reference potential (RFH) and a low reference potential (RFL). Each reference node (N41A–N43D) is a tap point in the string of resistors corresponding to a particular reference voltage. Each bank has a corresponding set of reference nodes, designated in a similar manner to the resistors (e.g., "A"–"D"). For example, resistors R40A–R43A include reference nodes N41A–N43A.

The coarse bank (410) of the ADC (400) includes three comparators (CP401–CP403). Comparator CP401 includes a first input that is coupled to an input node (N420), a second input that is coupled to a first reference node (N40B), and provides a first logic output (OUT1) for the coarse bank (410). Comparator CP402 includes a first input that is coupled to the input node (N420), a second input that is coupled to second reference node (N40C), and provides a second logic output (OUT2) for the coarse bank (410). Comparator CP403 includes a first input that is coupled to the input node (N420), a second input that is coupled to a third reference node (N40D), and provides a third logic output (OUT3) for the coarse bank (410). An input signal (INPUT) is provided to the input node (N420) and corresponds to the input signal of the ADC (400).

The fine bank (420) includes three comparators (CP411–CP413). Comparator CP411 includes a first input that is coupled to the input node (N420), a second input that is coupled to a first junction node (N411), and provides a first logic output (OUT41) for the fine bank (420). Comparator CP412 includes a first input that is coupled to the input node (N420), a second input that is coupled to a second junction node (N412), and provides a second logic output (OUT42) for the fine bank (420). Comparator CP413 includes a first input that is coupled to the input node (N420), a second input that is coupled to a third junction node (N413), and provides a third logic output (OUT43) for the fine bank (420).

Each bank of resistors ("A"–"D") is coupled the fine bank of comparators (420) through a corresponding set of three switches. In this example, a total of twelve switches (S41A–S43D) are organized into sets of switches (S41A–S43A, S41B–S43B, S41C–S43C, S41D–S43D). Each set of switches is coupled to corresponding sets of reference nodes in a particular bank (e.g. "A"–"D"). The first set of switches, S41A–S43A, is coupled to junction nodes N411–N413 respectively, such that when switches S41A–S43A are closed, junction node N411 is coupled to reference node N41A, junction node N412 is coupled to reference node N42A, and junction node N413 is coupled to reference node N43A. The second set of switches, S41B–S43B, is coupled to junction nodes N411–N413 in reverse order, such that when switches S41B–S43B are closed, junction node N411 is coupled to reference node N43B, junction node N412 is coupled to reference node N42B, and junction node N413 is coupled to reference node N41B. The third set of switches, S41C–S43C, is coupled to junction nodes N411–N413 respectively, such that when switches S41C–S43C are closed, junction node N41I is coupled to reference node N41C, junction node N412 is coupled to reference node N42C, and junction node N413 is coupled to reference node N43C. The fourth set of switches, S41D–S43D, is coupled to junction nodes N411–N413 in reverse order, such that when switches S41D–S43D are closed, junction node N411 is coupled to reference node N43D, junction node N412 is coupled to reference node N42D, and junction node N413 is coupled to reference node N41D.

Each logic output (OUT1–OUT3) of the coarse bank (410) corresponds to a logic low or a logic high value. The logic outputs (OUT1–OUT3) of the coarse bank (410) correspond to a thermometer code format. The value of the logic output (OUT1–OUT3) of the coarse bank (410) depends on whether the value of a particular analog input signal (INPUT) falls above or below the comparator's (CP401–CP403) associated reference node (N40B, N40C, N40D). Each comparator (CP401–CP403) of the coarse bank (410) outputs a "0" if the analog input signal (INPUT) has a value that is lower than the value of the comparator's associated reference node (N40B, N40C, N40D). Each comparator (CP401–CP403) of the coarse bank (410) outputs a "1" if the analog input signal (INPUT) has a value that is higher than the value of the comparator's associated reference node (N40B, N40C, N40D). As in the example shown in FIG. 1, the logic outputs of the coarse bank comparators appear similar to the mercury in a thermometer, with logic "1" outputs on the bottom comparators rising up to the logic "0" outputs on the top comparators.

For example, assume the analog input signal (INPUT) has a value corresponding to a value just above reference node N42B. Comparators CP402 and CP403 of the coarse bank (410) output a logic low (logic "0") because the value of the input signal (INPUT) is below the value of the comparators' (CP402, CP403) associated reference nodes (N40C, N40D). Comparator CP401 of the coarse bank (410) outputs a logic high (logic "1") because the value of the analog input signal (INPUT) is higher than the value of the comparator's (CP401) associated reference node (N40B).

The logic outputs (OUT1–OUT3) of the coarse bank (410) are evaluated by a logic circuit (not shown) to produce control signals. The control signals correspond to a particular thermometer code. Based on the thermometer code, a particular set of switches is selected by the control signals. The particular set of switches selected corresponds to a particular resistor bank. The selected resistor bank includes a corresponding set of reference values that are in a range of values of the analog input signal (INPUT). The corresponding set of reference values are coupled to the inputs of the fine bank of comparators (420).

For example, if the analog input signal (INPUT) has a value corresponding to a value just above reference node N42B, the logic circuit (not shown) actuates switches S41B–S43B. Closing switches S41B–S43B couples reference nodes N41B–N43B to corresponding junction nodes N411–N413. Comparator CP411 of the fine bank (420) outputs a logic low (logic "0") because the value of the input signal (INPUT) is below the value of the comparator's (CP411) associated reference node (N43B). Comparators CP412 and CP413 of the fine bank (420) output a logic high (logic "1") because the value of the input signal (INPUT) is higher than the comparators' (CP412, CP413) associated reference nodes (N41B, N42B). The logic outputs (OUT41–OUT43) of the fine bank (420) in this example produce a reverse thermometer code. A reverse thermometer code is the opposite of a thermometer code, with logic "0" outputs on the bottom comparators rising up to the logic "1" outputs on the top comparators.

As can be observed from the example, the logic outputs (OUT41–OUT43) of the fine bank (420) produce one of a thermometer code and a reversed thermometer code. The logic outputs (OUT41–OUT43) produce a thermometer code or reverse thermometer code depending on which set of switches (e.g. S41B–S43B) is selected. A selected set of switches (e.g. S41B–S43B) results in a different type of code than the code that results when selecting an adjacent of switches (e.g. for S41B–S43B: S41A–S43A and S41C–S43C). For example, switches S41A–S43A are adjacent to switches S41B–S43B. Since selecting switches S41B–S43B results in logic outputs OUT41–OUT43 corresponding to a reverse thermometer code, selecting switches S41A–S43A results in logic outputs OUT41–OUT43 corresponding to a thermometer code.

The thermometer code is reversed for each adjacent set of switches because the connections for each adjacent set of switches are reversed. The architecture used for coupling the switches (S41A–S43D) and reference nodes (N41A–N43D) to the junction nodes (N411–N413) is a ladder-flip architecture where the connection for each adjacent set of switches is flipped. Each adjacent set of switches (S41A–S43A, S41B–S43B, S41C–S43C, S41D–S43D) is coupled to the junction nodes (N411, N412, N413) in opposite order. By coupling each set of switches (S41A–S43A, S41B–S43B, S41C–S43C, S41D–S43D) in opposite order, the switches associated with each comparator (CP411–CP413) of the fine bank (420) are equidistant from the major code boundary for adjacent sets of switches. For example, switch S43A and switch S41B are coupled to an input to comparator CP413 at junction node 413. Switches S43A and S41B are on opposite sides of the code boundary at reference node N40B. As the sets of switches S41A–S43A and S41B–S43B are adjacent, and switches S43A and S41B are both associated with the same comparator (CP413) of the fine bank (420), the switches (S43A and S41B) are equidistant from reference node N40B at the major code *boundary. The major code boundaries occur in FIG. 4 at the borders between the adjacent sets of switches (S41A–S43A, S41B–S43B, S41C–S43C, S41D–S43D) (i.e. at nodes N40B, N40C, and N40D). As previously discussed in connection with FIG. 3, the ladder-flip architecture illustrated in FIG. 4 reduces the DNL errors at the major code boundaries by using the same comparator for the comparisons on each side of the major code boundary.

The logic outputs (OUT41–OUT43) are combined with the coarse-logic outputs (OUT1–OUT3) through decoding logic (not shown) to obtain an output code (not shown) that corresponds to the analog-to-digital conversion of the analog input signal (INPUT). In light of the description contained herein, it is understood and appreciated that the output code can be a binary code or any other type of code.

Figure 5:
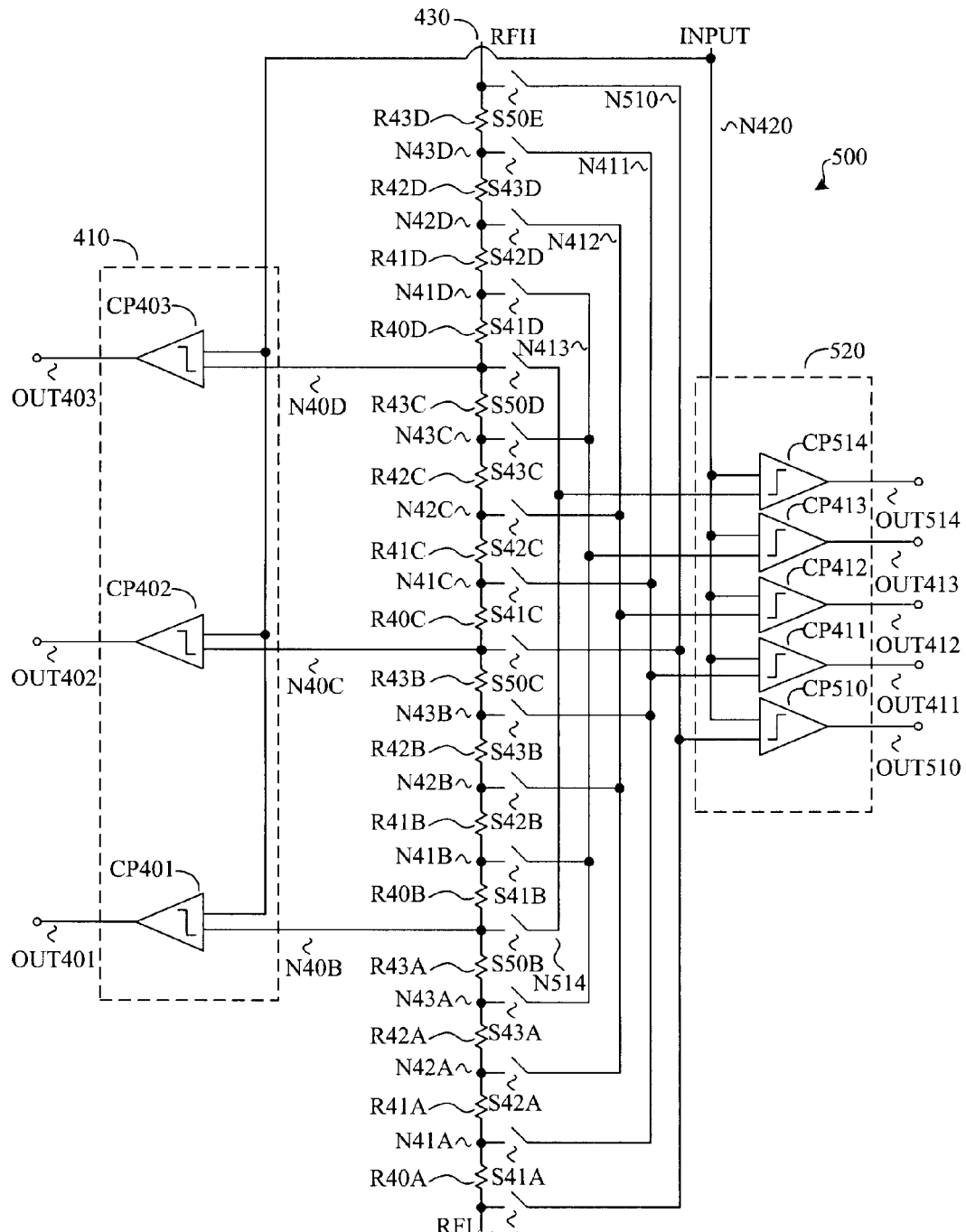
FIG. 5 illustrates another subranging ADC that reduces DNL error at major code boundaries, in accordance with the present invention.

FIG. 5 illustrates another example subranging ADC that reduces DNL error at major code boundaries according to the present invention. The ADC (500) includes a reference voltage circuit (430), a coarse bank of comparators (410), and a fine bank of comparators (520). The ADC (500) shown in FIG. 5 is similar to the ADC (400) shown in FIG. 4. The components that are common to ADC 400 and ADC 500 are labeled identically. Reference voltage circuit 430 is arranged the same as the reference voltage circuit (430) of FIG. 4. Coarse bank 410 is also arranged the same as the coarse bank (410) of FIG. 4.

Fine bank 520 is arranged similarly to the fine bank (420) of FIG. 4 with the addition of two comparators (CP510, CP514). The two additional comparators (CP510, CP514) are coupled to the reference voltage circuit (430) through two additional corresponding junction nodes (N510, N514), and five additional switches (S50A, S50B, S50C, S50D, S50E). The remaining three comparators (CP411–CP413) of the fine bank (520) in FIG. 5 are arranged the same as the three comparators (CP411–CP413) of the fine bank (420) in FIG. 4.

Comparator CP510 of the fine bank (520) includes an input that is coupled to a corresponding first additional junction nodes (N510), another input that is coupled to the input node (N420), and an additional logic output (OUT510) for the fine bank (520). Comparator CP514 of the fine bank (520) includes an input that is coupled to a corresponding second additional junction node (N514), another input that is coupled to the input node (N420), and an additional logic output (OUT514) for the fine bank (520).

Switch S50A is series coupled between the first additional junction node (N510) and the low reference potential (RFL). Switch S50B is series coupled between the second junction node (N514) and a references node (N50B). Switch S50C is series coupled between the first additional junction node (N510) and a reference node (N50C). Switch S50D is series coupled between the second additional junction node (N514) and a references node (N50D). Switch S50E is series coupled between the first additional junction node (N510) and the high reference potential (RFH).

The number of fine bank comparators that are utilized effects the ability of a subranging ADC to correct inconsistencies between the results of the coarse bank comparators and the results of the fine bank comparators. The inconsistencies between the coarse bank and the fine bank can be attributed to the design of each bank. As the results of the coarse bank effect the operation of the fine bank, the coarse bank is often designed for speed over accuracy. The fine bank can override the results of the coarse bank using the additional fine bank comparators. The ADC (500) illustrated in FIG. 5 includes a higher number of fine bank comparators than the ADC (400) illustrated in FIG. 4 (five fine bank comparators rather than three), resulting in a greater ability of the fine bank to override the results of the coarse bank. In order to implement the increased error correction with the additional comparators, the number of switches in each set of switches (S50A, S41A–S43A, S50B; S50B, S41B–S43B, S50C; S50C, S41C–S43C, S50D; S50D, S41D–S43D, S50E) is increased from three to five. The switches that border the major code boundaries are shared between adjacent banks of switches. For example,. switch S50B is located at the major code boundary, and shared between a bank of switches (S50A, S41 A–S43A, S50B) and the adjacent bank of switches (S50B, S41B–S43B, S50C). When either adjacent set of switches (e.g., S50A, S41A–S43A, S50B and S50B, S41B–S43B, S50C) is actuated (switches in the set are closed), the additional switch (e.g., S50B) at the boundary closes as part of that set. By sharing at least one switch (e.g., S50B, S50C) at the major code boundary, each set of switches (e.g., S50B, S41B–S43B, S50C) overlaps its adjacent sets of switches (e.g., S50A, S41A–S43A, S50B and S50C, S41C–S43C, S50D). In light of the above discussion, it is understood and appreciated that the sets of switches (S50A, S41A–S43A, S50B; S50B, S41B–S43B, S50C; S50C, S41C–S43C, S50D; S50D, S41D–S43D, S50E) in FIG. 5 can overlap by more than a single switch. Overlapping the sets of switches by more than single switch reduces the bit resolution while increasing the comparator accuracy.

The additional comparators (CP510, CP514) and additional switches (S50A, S50B, S50C, S50D, S50E) reduce the effect of DNL errors in the ADC (500). As stated in connection with FIG. 4, the major code boundaries for the architecture in FIG. 5 occur at the border between adjacent sets of switches, where the course comparators transition between one bank and another. Also similar to the ADC (400) in FIG. 4, the same comparator (CP510, CP411–CP413, CP514) is used for comparing the value of the reference nodes (N50B, N50C, N50D) at each major code boundary in FIG. 5 to value of the input signal (INPUT). However, in FIG. 5 the same switch (S50B, S50C, S50D), same circuit wiring (not shown), and same reference node (N50B, N50C, N50D) is also used to make the comparison at the major code boundary.

As discussed with reference to FIGS. 1–3, the ladder-flip architecture illustrated in FIG. 5 reduces the DNL errors at the major code boundaries. However, the overlapping ladder-flip architecture in FIG. 5 further reduces effect of DNL errors in the ADC (500) by eliminating the errors that could occur from using different switches, circuit wiring (not shown), different comparators, and/or reference nodes for the comparison at the major code boundary.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus for producing logic outputs from an analog input voltage, comprising:
a reference voltage circuit that has a first set of reference values and a second set of reference values, the first and second set of reference values each arranged in an ascending order and having a common reference value that corresponds to a major code boundary;
a coarse comparator that produces a coarse logic output that corresponds to a comparison between the analog input voltage and the common reference value; and
at least two fine comparators that produce fine logic outputs that correspond to a comparison between the analog input voltage and a selected one of the first and second sets of reference values, the fine logic outputs having an ascending order when the first set of reference values is selected, matching the ascending order of the first set of reference values, and the fine logic output having a descending order when the second set of reference values is selected, opposite the ascending order of the second set of reference values, such that the fine logic outputs correspond to a first code type when the first set of reference values is selected and correspond to a second code type when the second set of reference values is selected, the second code type being different from the first code type, whereby differential nonlinearity errors across the major code boundary are minimized.

2. The apparatus of claim 1, wherein each reference value associated with a particular fine comparator of the first and second sets of reference values is equidistant about the major code boundary.

3. The apparatus of claim 1, wherein the common reference value is used by the first set of reference values when the first set of reference values is selected and by the second set of reference values when the second set of reference values is selected.

4. The apparatus of claim 1, wherein one of the first and second sets of reference values is selected in response to a control signal by closing switches that are coupled between each of the reference values of the selected one of the first and second sets of reference values and the at least two fine comparators.

5. The apparatus of claim 4, wherein a switch control logic circuit produces the control signal in response to the coarse logic output.

6. The apparatus of claim 4, wherein a switch control logic circuit produces the control signal in response to the value of the coarse logic output and includes an output encoding logic circuit that produces a digital signal in response to the coarse logic output and the fine logic outputs.

7. The apparatus of claim 1, wherein an output encoding logic circuit produces a digital signal in response to the coarse logic output and the fine logic outputs.

8. The apparatus of claim 7, wherein the output encoding logic circuit selects one of a first encoder circuit and a second encoder circuit in response to the coarse logic output, whereby the first encoder circuit encodes the first code type and the second encoder circuit encodes the second code type to produce the digital signal.

9. The apparatus of claim 7, wherein the most-significant-bits (MSBs) of the digital output are associated with the coarse logic output and the least-significant-bits (LSBs) of the digital output are associated with the fine logic outputs.

10. The apparatus of claim 1, wherein the first code type is a thermometer code and the second code type is a reverse thermometer code.

11. The apparatus of claim 10, wherein the thermometer code and the reverse thermometer code are analyzed by correction logic prior to producing the digital signal, whereby possible errors in the thermometer code and reverse thermometer code are identified and corrected before the digital signal is generated.

12. A method of converting an analog input voltage to a digital code, comprising:

comparing the analog input voltage to a major reference value that corresponds to a major code boundary in a series of reference values;

producing a coarse logic output in response to the comparison of the analog input voltage to the major reference value; the coarse logic output indicating whether the analog input voltage is one of higher and lower than the major reference value;

selecting one of a first and second bank of reference values that are each arranged in an ascending order in response to the coarse logic output, selecting the first bank when the analog input voltage is higher than the major reference value and selecting the second bank when the analog input voltage is lower than the major reference value;

comparing the analog input voltage to the selected bank of reference values;

producing a fine logic output in response to the comparison between the analog input voltage to the selected bank of reference values, the fine logic output having an ascending order of values corresponding to the ascending order of the first bank of reference values when the first bank of reference values is selected, and the fine logic output having an descending order of values opposite the ascending order of the second bank of reference values when the second bank of reference values is selected, such that the fine logic output is a first code type when the selected bank is the first reference bank and a second code type when the selected bank is the second reference bank, the first code type being different from the second code type; and producing the digital code in response to the coarse logic output and fine logic output, wherein errors occurring in the digital code are minimized.

13. The method of converting an analog input voltage to a digital signal as in claim 12, wherein the selected bank of reference values is selected in response to a control signal that is produced by a switch control logic circuit in response to the coarse logic output.

14. The method of converting an analog input voltage to a digital signal as in claim 12, wherein the switch control logic circuit is combined with the output encoding logic circuit into a single logic circuit.

15. The method of converting an analog input voltage to a digital signal as in claim 12, wherein the first and second bank of reference values share the major reference value, the first bank of reference values using the major reference value when selected and the second bank of reference values using the major reference value when selected.

16. The method of converting an analog input voltage to a digital signal as in claim 12, wherein the first code type is a thermometer code and the second code type is a reverse thermometer code.

17. The method of converting an analog input voltage to a digital signal as in claim 16, wherein the thermometer code and reverse thermometer code are analyzed by correction logic prior to producing the digital code, whereby possible errors in the thermometer code and reverse thermometer code are identified and corrected before the digital signal is generated.

18. An apparatus for converting an analog input voltage to a digital signal, comprising:

a coarse comparison means for comparing the analog input voltage to a voltage of a common reference node to produce a coarse output;

an ordered set of junction nodes that have associated discrete voltages arranged in an order;

junction means for providing discrete voltages corresponding to an ordered set of junction nodes arranged in an ascending order;

a fine comparison means for comparing the analog input voltage to the associated discrete voltages to produce a fine output, the fine comparison means arranged in an ascending order such that each of the fine comparison means has a unique corresponding junction node of the ordered set of junction nodes;

means for selecting one of a first and second set of reference nodes, the first and second set of reference nodes having a common major code boundary corresponding to the common reference node;

means for selectively coupling the ordered set of junction nodes to the selected one of a first and second set of reference nodes such that the first set of reference nodes is coupled to the ordered set of junction nodes in an ascending order when selected, matching the ascending order of the second set of comparison means, and the second set of reference nodes is coupled to the ordered set of junction nodes in a descending order when selected, opposite the ascending order of the second set of comparison means, whereby differential nonlinearity errors occurring at the major code boundaries are minimized; and means for producing the digital signal in response to the coarse output and fine output.

19. An apparatus as in claim 18, further comprising means for correcting errors in the coarse output and the fine outputs prior to producing the digital signal, whereby possible errors in the coarse output and fine output are identified and corrected before the digital signal is generated.

20. An apparatus as in claim 18, wherein the selected one of the first and second set of reference nodes use the common reference node when selected such that when the first set of reference nodes is selected the common reference node is a reference node of the first set, and when the second set of reference nodes is selected the common reference node is a reference node the second set.

* * * * *

UNITED STATES PATENT AND TRADEMARK OFFICE
CERTIFICATE OF CORRECTION

PATENT NO.   : 6,590,518 B1
DATED         : July 8, 2003
INVENTOR(S)  : Robert Callaghan Taft It is certified that error appears in the above-identified patent and that said Letters Patent is hereby corrected as shown below:

Column 2,
Line 29, replace "comparator. comparing" with -- comparator comparing --.

Column 6,
Line 39, replace "Sna, S1x," with -- Sna,...S1x --.

Column 8,
Line 26, replace "OV" with -- 0V --.

Column 10,
Line 61, replace "N41I" with -- N411 --.

Column 12,
Line 33, remove "*".

Column 13,
Line 39, replace "example,. switch" with -- example, switch --.

Column 15,
Line 45, replace "having an descending" with -- having a descending --.

Column 16,
Line 63, replace "node the second" with -- node of the second --.

Signed and Sealed this

Second Day of December, 2003

JAMES E. ROGAN
*Director of the United States Patent and Trademark Office*